(12) United States Patent
Yamauchi et al.

(10) Patent No.: US 8,654,097 B2
(45) Date of Patent: Feb. 18, 2014

(54) ELECTROSTATIC CAPACITIVE TOUCH SENSOR DEVICE

(75) Inventors: Kazuto Yamauchi, Okazaki (JP);
Yasunori Murayama, Ichinomiya (JP);
Sadahiko Tanaka, Okazaki (JP);
Keitaro Takizawa, Okazaki (JP);
Kouichi Yamanoue, Yokohama (JP)

(73) Assignees: Mitsubishi Jidosha Kogyo Kabushiki Kaisha, Tokyo (JP); Visteon Japan, Ltd., Kanagawa (JP)

( * ) Notice: Subject to any disclaimer, the term of this patent is extended or adjusted under 35 U.S.C. 154(b) by 551 days.

(21) Appl. No.: 12/878,462

(22) Filed: Sep. 9, 2010

(65) Prior Publication Data

US 2010/0328266 A1 Dec. 30, 2010

Related U.S. Application Data

(63) Continuation of application No. PCT/JP2008/073633, filed on Dec. 25, 2008.

(30) Foreign Application Priority Data

Mar. 31, 2008 (JP) ................................. 2008-094389

(51) Int. Cl.
*G06F 3/045* (2006.01)
*G06F 3/044* (2006.01)
*G08C 21/00* (2006.01)

(52) U.S. Cl.
USPC ....................................... 345/174; 178/18.06

(58) Field of Classification Search
USPC ......... 345/174, 178; 178/18.06, 18.07, 18.08, 178/19.03, 20.01, 20.02, 20.03, 20.04
See application file for complete search history.

(56) References Cited

U.S. PATENT DOCUMENTS

| | | | | |
|---|---|---|---|---|
| 5,216,292 A | * | 6/1993 | Imazu et al. | 326/86 |
| 5,218,242 A | * | 6/1993 | Imazu et al. | 326/30 |
| 5,247,581 A | * | 9/1993 | Gurcan | 381/321 |
| 5,457,289 A | * | 10/1995 | Huang et al. | 178/18.08 |
| 5,574,262 A | * | 11/1996 | Petty | 178/18.02 |
| 5,798,709 A | * | 8/1998 | Flaxl | 340/10.34 |
| 6,509,747 B2 | | 1/2003 | Nagai et al. | |
| 6,828,806 B1 | | 12/2004 | Hirota et al. | |
| 2003/0155966 A1 | * | 8/2003 | Harrison | 330/9 |

FOREIGN PATENT DOCUMENTS

| | | |
|---|---|---|
| DE | 101 31 243 C1 | 11/2002 |
| DE | 10 2007 012 111 A1 | 10/2007 |
| JP | 11-268607 A | 10/1999 |
| JP | 2000-80703 A | 3/2000 |

(Continued)

OTHER PUBLICATIONS

International Preliminary Report and Written Opinion issued in PCT/JP2008/073633 on Dec. 13, 2010.

(Continued)

*Primary Examiner* — Jeff Piziali
(74) *Attorney, Agent, or Firm* — Birch, Stewart, Kolasch & Birch, LLP

(57) ABSTRACT

An electrostatic capacitive touch sensor device includes sensing electrode provided at a plurality of positions, a high-frequency signal source that applies a high-frequency signal to the sensing electrode through a predetermined impedance element, a wiring portion that connects the sensing electrode and the impedance element, a shield portion provided to embrace the sensing electrodes and the connecting pattern, and a shield signal source that applies a shield signal to the shield portion and has the same phase and amplitude as the high-frequency signal source.

3 Claims, 5 Drawing Sheets

(56) References Cited

FOREIGN PATENT DOCUMENTS

| | | |
|---|---|---|
| JP | 2001-94408 A | 4/2001 |
| JP | 2007-303895 A | 11/2007 |
| JP | 2007-324088 A | 12/2007 |
| JP | 2007324088 A * | 12/2007 ............. H01H 36/00 |

OTHER PUBLICATIONS

Germany Office Action issued in Germany Application No. 11 2008 003 793.0 on Oct. 23, 2013, 9 pages.

* cited by examiner

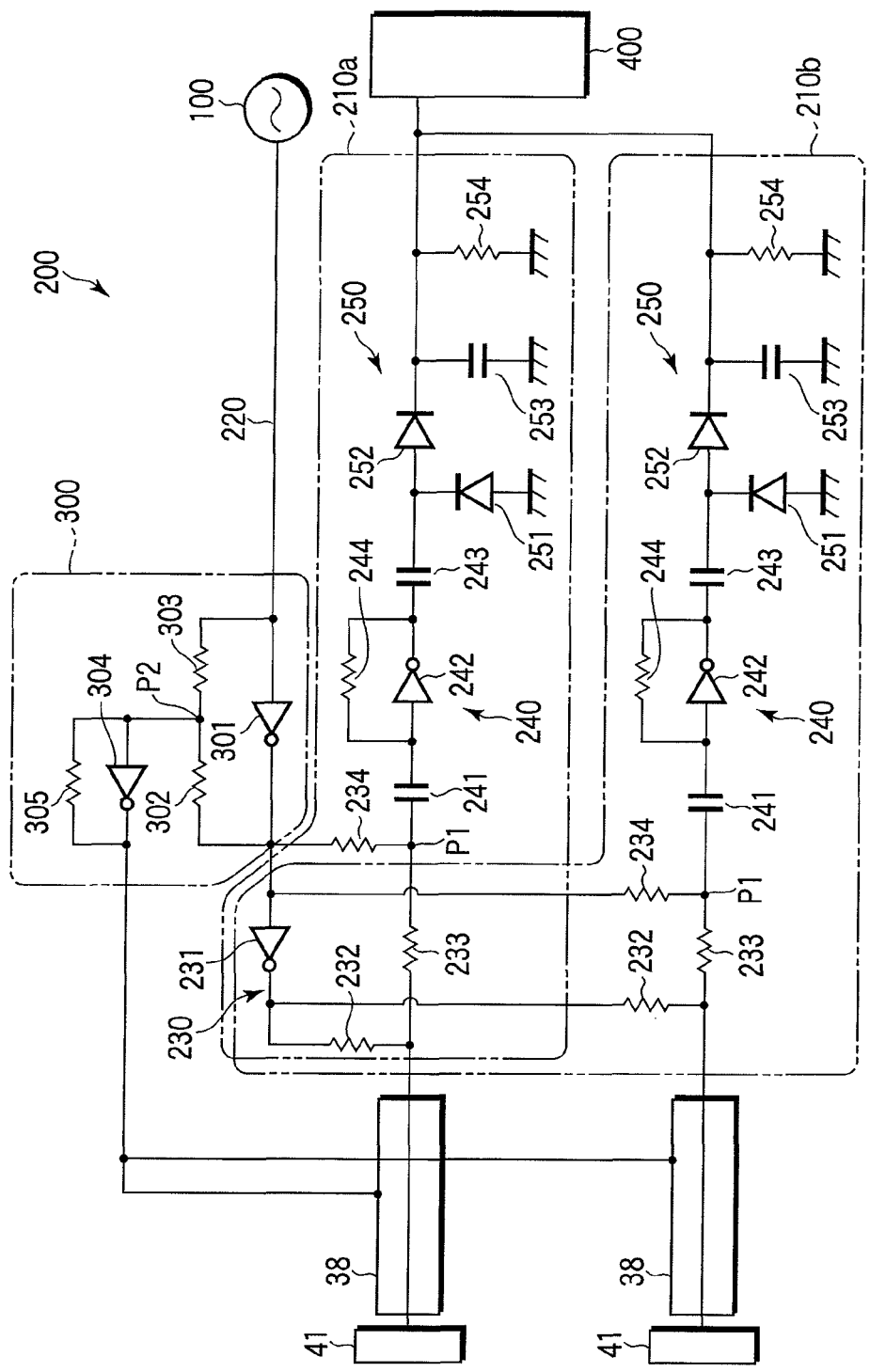
F I G. 5

ELECTROSTATIC CAPACITIVE TOUCH SENSOR DEVICE

CROSS-REFERENCE TO RELATED APPLICATIONS

This is a Continuation application of PCT Application No. PCT/JP2008/073633, filed Dec. 25, 2008, which was published under PCT Article 21(2) in Japanese.

This application is based upon and claims the benefit of priority from prior Japanese Patent Application No. 2008-094389, filed Mar. 31, 2008, the entire contents of which are incorporated herein by reference.

BACKGROUND OF THE INVENTION

1. Field of the Invention

The present invention relates to an electrostatic capacitive touch sensor device for use in a switch device for operational input to, for example, an electronic device.

2. Description of the Related Art

Conventionally, in order to operate, for example, an audio device mounted in a car, a switch panel device is installed at a position on the dashboard allowing easy operation by the driver or passenger. Several switch panel devices as described are provided with electrostatic sensors.

In a switch panel device of this type, a sensing electrode is formed at a portion of a panel section which an operator touches to operate the switch panel device. The sensing electrode is applied with a signal (voltage) output from a power supply. The sensing electrode is connected to a sensing circuit.

When an operator touches the sensing electrode, a slight amount of current flows from the sensing electrode to the operator. Therefore, a voltage value changes in a download side of the sensing electrode between when an operator touches the sensing electrode and when the operator does not touch the sensing electrode. By detecting the change, the sensing circuit senses that the switch panel device has been operated.

The sensing circuit is provided outside the panel section of the switch panel device. Therefore, a connection pattern for electrically connecting the sensing electrode to the sensing circuit is formed on the panel section.

However, when an operator touches the connection pattern through the panel section, a slight amount of current then flows to the operator, and a voltage value in a download side of the connection pattern therefore changes. Even in this case, the sensing circuit detects change of the voltage value. As a result of this, the operator is recognized to have touched the sensing electrode. It is not preferred that the sensing circuit detects change in voltage which is caused by a touch of the operator on the connection pattern.

Therefore, a shield electrode for covering the connection pattern is provided so that the sensing circuit may not detect a touch when an operator touches a connection pattern. Even when an operator touches a portion where the connection pattern is provided in the panel section, a current flows from the shield electrode to the operator while a current is restricted from flowing from the connection pattern to the operator.

According to the prior art for a shield method of this type, the shield electrode is branched from between the sensing electrode and the sensing circuit. A technique of this type is disclosed in Jpn. Pat. Appln. KOKAI Publication No. 11-268607.

Therefore, in the case of using a plurality of sensing electrodes to form a large number of operation switches like an operation switch for a car, a plurality of independent shield electrodes respectively paired with the sensing electrodes, and a plurality of independent circuit means are required between the shield electrodes and the sensing electrodes are required. Consequently, if a large number of operation switches are provided, not only the shield electrodes are difficult to be laid out but also costs for the circuit means for supplying signals to the shield electrodes increase.

Further, in a car occupant sensing system disclosed in Jpn. Pat. Appln. KOKAI Publication No. 11-268607, a shield electrode is branched from between a sensing electrode and a sensing circuit. If electrical noise which propagates in the air is applied to the sensing electrode, a signal supplied to the shield electrode becomes an electrical signal equal to the noise, and the effect of shield against electrical noise decreases.

That is, on a wiring connecting the sensing circuit and the sensing electrode, a voltage acting on the wiring changes owing to application of noise to the sensing electrode. Therefore, in the case of a structure in which a shield electrode is branched from a wiring connecting a sensing circuit and a sensing electrode, as disclosed in Jpn. Pat. Appln. KOKAI Publication No. 11-268607, a voltage value applied to the shield electrode is influenced by change in voltage caused by noise affecting the sensing electrode.

As a result of this, the voltage value applied to the shield electrode is considered to change under influence of external noise.

SUMMARY OF THE INVENTION

An object of the present invention is to provide an electrostatic capacitive touch sensor device which simplifies a structure of shield electrodes in a touch switch device including a large number of operation switches and obtains high effect of shield against external electrical noise without causing an increase in number of circuit means for supplying signals to the shield electrodes.

According to an aspect of the embodiments, an electrostatic capacitive touch sensor device includes a sensing electrode, a wiring portion that connects the sensing electrode and detector circuit, a shield portion provided around the sensing electrode and the wiring portion, and a shield signal source that applies voltage to the shield portion. The shield signal source is electrically connected to the sensing electrode through a predetermined impedance element and has a same phase and amplitude as the high-frequency signal source.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 5 is a circuit diagram illustrating the circuit device illustrated in FIG. 1.

DETAILED DESCRIPTION OF THE INVENTION

A panel device according to an embodiment of the present invention will now be described with reference to FIGS. 1 to 6. An electrostatic capacitive touch sensor device according to the present embodiment is exemplarily provided in a switch panel device 10. The switch panel device 10 is a switch panel device, for example, for performing input operation on an audio device mounted on a car.

Figure 1:
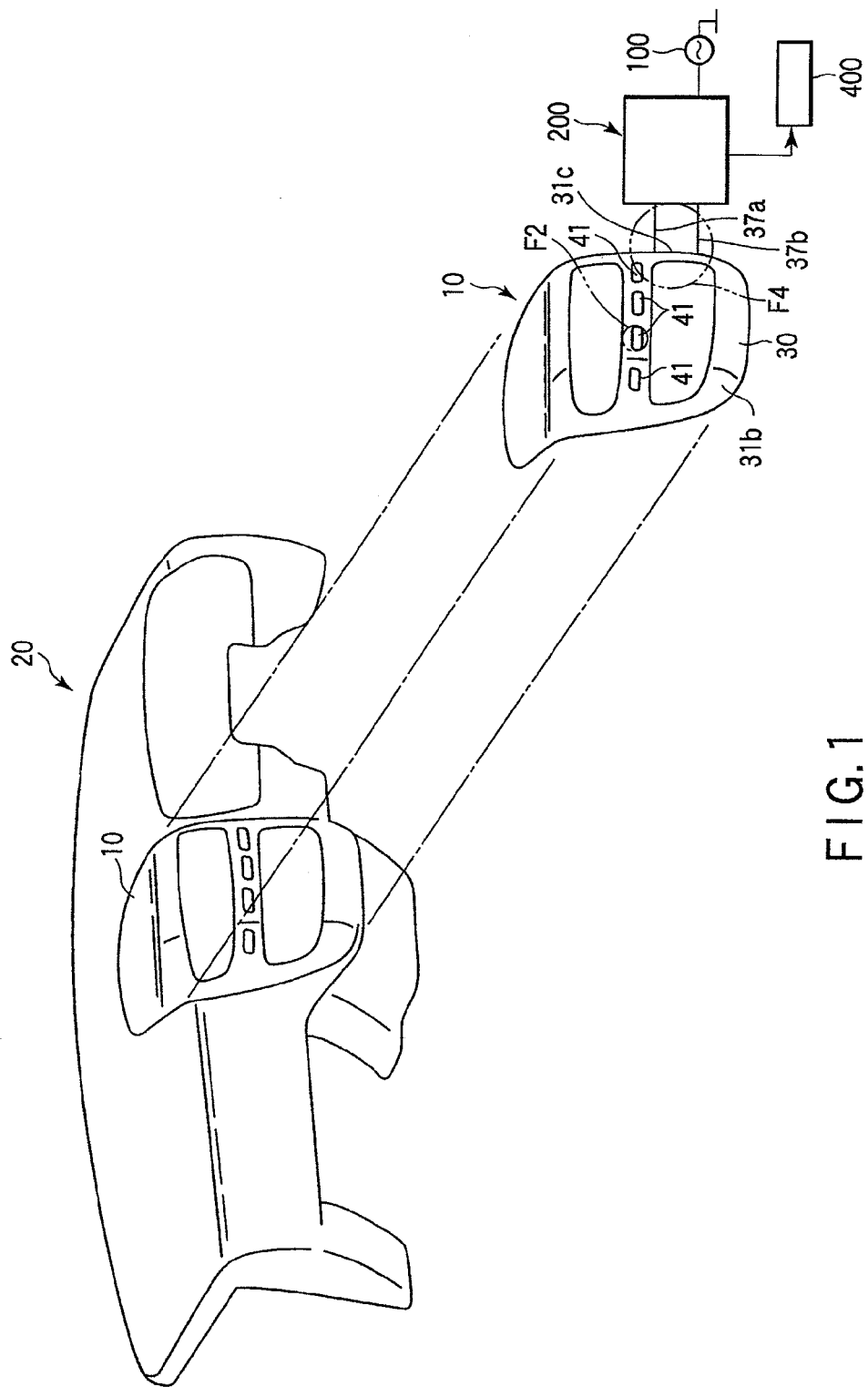
FIG. 1 is a perspective view illustrating an instrumental panel in which a panel device including a circuit device according to an embodiment of the present invention is built.

FIG. 1 illustrates an instrument panel 20 in which the switch panel device 10 is built. FIG. 1 also illustrates a state where the switch panel device 10 is disassembled. The switch panel device 10 includes a panel body 30, a high frequency power supply 100, and a circuit device 200. The panel body 30 defines an exterior shape of the switch panel device 10. The panel body 30 will be described in details later.

The panel body 30 is provided with a touch sensing electrode 41. As illustrated in FIG. 1, the touch sensing electrode 41 is an electrode which a car occupant touches when carrying out operation. A plurality of touch sensing electrodes 41 are provided in the panel body 30. The touch sensing electrodes 41 are electrically connected to the circuit device 200 described later.

Figure 2:
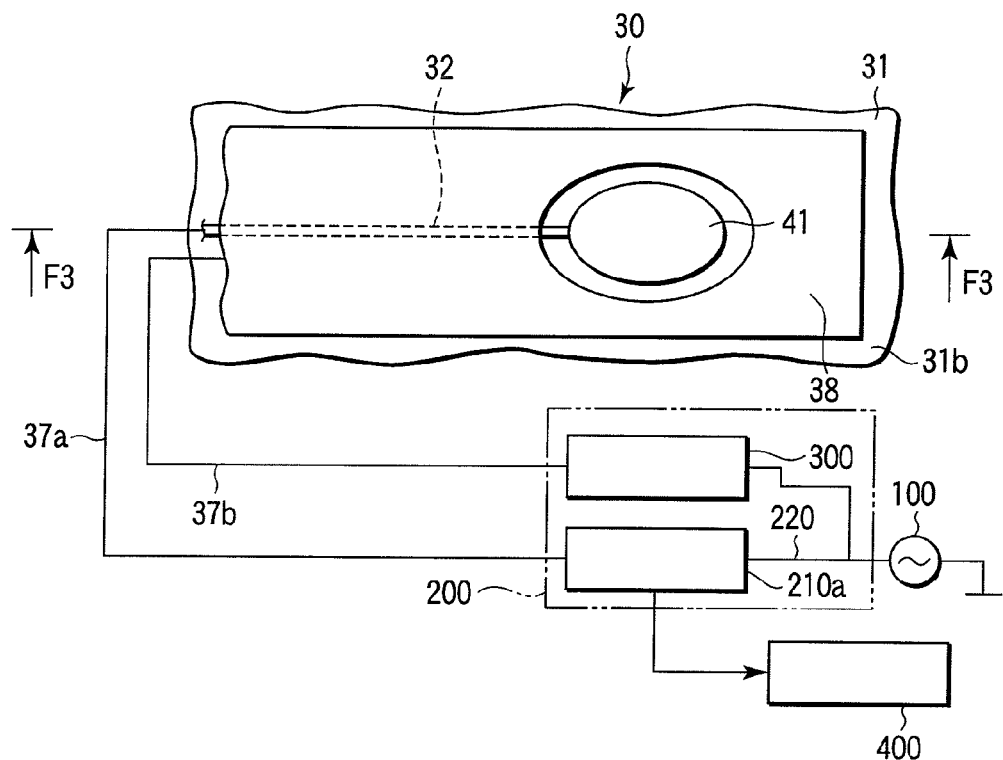
FIG. 2 is a schematic view illustrating an area F2 surrounded by a two-dot chain line in FIG. 1.

FIG. 2 is a plan view illustrating an area F2 enlarged, which is surrounded by a two-dot chain line in FIG. 1. FIG. 2 illustrates the switch panel device 10 (panel body 30) viewed from outside, and illustrates only a vicinity of one of the plurality of touch sensing electrodes 41 formed in the switch panel device 10.

Vicinities of the respective touch sensing electrodes 41 in the panel body 30 may all have the same structure as each other. Therefore, the structure of the switch panel device 10 will be described with reference to a structure of a vicinity of one of the touch sensing electrode 41 illustrated in FIG. 2.

Figure 3:
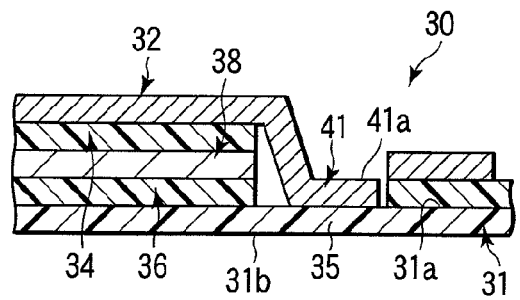
FIG. 3 is a cross-sectional view of a panel body illustrated along a line F3-F3 denoted in FIG. 2.

FIG. 3 is a cross-sectional view of the panel body 30 illustrated along a line F3-F3 in FIG. 2. FIG. 3 is a cross-sectional view of the vicinity of one touch sensing electrode 41 in the panel body 30.

As illustrated in FIG. 3, the panel body 30 includes a touch sensing electrode 41, a panel section 31, a design layer 36, a connection pattern 32, a shield electrode 38 (shield portion), and an insulating layer 34.

The panel section 31 defines an exterior shape of the switch panel device 10 (panel body 30). The panel section 31 is made of a resin sheet 35. The resin sheet 35 is formed of, for example, transparent resins.

The touch sensing electrode 41 is provided on one surface 31a of the panel section 31. An operator touches the touch sensing electrode 41 through the panel section 31 (i.e., from above the panel section 31). The operator touches the touch sensing electrode 41 from a side of the other surface 31b opposite to the one surface 31a. The other surface 31b is exposed to a car cabin.

The design layer 36 is stacked on the one surface 31a of the panel section 31, and defines colors, decorative patterns and the like of the panel body 30. Colors and decorative patterns of the panel body 30 are recognized by seeing the design layer 36 through the panel section 31. The design layer 36 is formed by printing, for example, an ink and the like to form the design layer 36. The design layer 36 is not layered in an area of a vicinity of the touch sensing electrode 41 including the touch sensing electrode 41.

The connection pattern 32 is formed in a side of the one surface 31a of the panel section 31. The connection pattern 32 is electrically connected to the touch sensing electrode 41, and is provided to electrically connect the touch sensing electrode 41 to the circuit device 200 described later. The connection patter 32 has a property of conducting electricity. The connection pattern 32 is formed by printing, for example, an ink having a property of conducting electricity.

In the present invention, the side of the one surface 31a is intended to refer to a side where the surface 31a exists. Therefore, being provided in the side of the surface 31a is a concept including a case of being provided on the one surface 31a and another case of not being provided on the one surface 31a but being provided in the side where the one surface 31a exists in relation to the panel section 31 as a boundary. Therefore, in actual, the connection pattern 32 which is provided on an insulating layer 34 described later is not formed on the surface 31a but is formed in the side of the one surface 31a.

Figure 4:
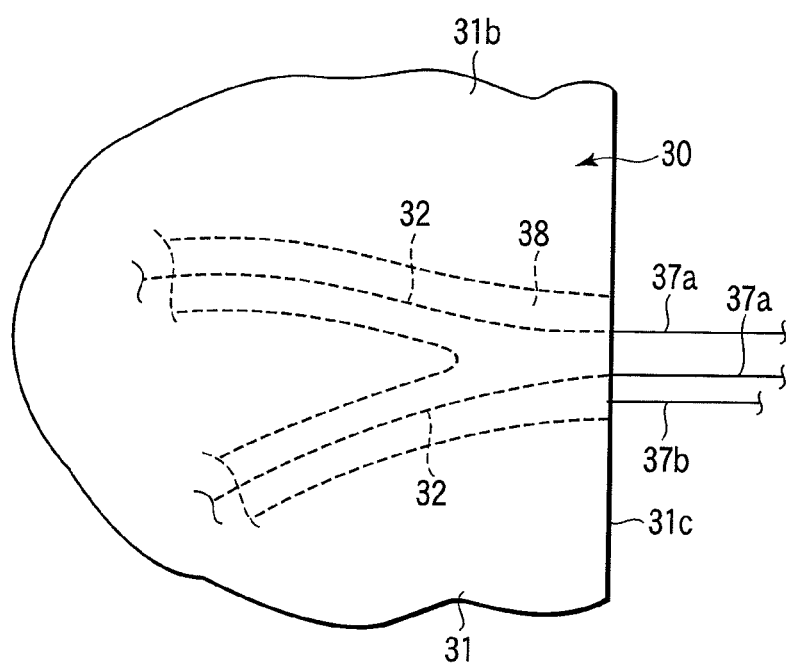
FIG. 4 is a schematic view illustrating an area surrounded by F4 denoted in FIG. 1.

As illustrated in FIG. 1, [a]the circuit device 200 is located outside the panel body 30. Therefore, the connection pattern 32, shown in FIG. 3, extends to, for example, an edge 31c of the panel section 31, and is electrically connected to a first wiring 37a (wiring portion). FIG. 4 schematically illustrates an area surrounded by a circle in FIG. 1. FIG. 4 schematically illustrates a vicinity of an edge 31c of the panel section 31. As illustrated in FIG. 4, the connection pattern 32 extends also to the edge 31c.

As illustrated in FIGS. 1 and 4, the connection pattern 32 is electrically connected to the circuit device 200 through a pair of wirings [37a] the first wiring 37 including from the edge 31c (collectively, wiring portion). Therefore, the touch sensing electrode 41 is electrically connected to the circuit device 200 through the connection pattern 32 and the first wiring 37a.

As illustrated in FIG. 3, the shield electrode 38 is located between the connection pattern 32 and the design layer 36, and is stacked on the design layer 36. The shield electrode 38 has an area covering the connection pattern 32. The shield electrode 38 has a property of conducting electricity.

The shield electrode 38 is electrically connected to the circuit device 200 described later, and is applied with a voltage having the same amplitude and phase as a voltage applied to the touch sensing electrode 41.

As a result of this, even when an operator touches a part of the panel section 31 where the connection pattern 32 is provided from the side of the surface 31b of panel section 31, a current flows from the shield electrode 38 to the operator. A current is thereby restricted from the connection pattern 32 to the operator.

Therefore, in an area of the panel section 31 where the connection pattern 32 is formed, the shield electrode 38 is formed, and the connection pattern 32 and the shield electrode 38 are opposed to each other. The shield electrode 38 is formed by printing, for example, an ink having a property of conducting electricity.

As illustrated in FIG. 3, the shield electrode 38 is neither formed on the touch sensing electrode 41 nor in the vicinity of the touch sensing electrode 41. Therefore, the shield electrode 38 and the touch sensing electrode 41 are not electrically connected to each other.

This is because the shield electrode 38 and the touch sensing electrode 41 are prevented from being connected to each other in consideration of errors occurring in formation of the shield electrode 38 and errors occurring in formation of the panel body 30 (e.g., in the case of shape-forming).

As illustrated in FIG. 1, the circuit device 200 is provided outside the panel body 30. Therefore, as illustrated in FIG. 4, the shield electrode 38 extends to an edge 31c of the panel section 31, and is electrically connected to a second wiring 37b. The second wiring 37b is electrically connected to the circuit device 200. The shield electrode 38 is electrically connected to the circuit device 200 through the second wiring 37b.

A single connection pattern 32 is provided for each one of the touch sensing electrodes 41. Accordingly, the switch panel device 10 includes a plurality of connection patterns 32. The connection patterns 32 are not electrically connected to each other. The shield electrodes 38 provided respectively for the connection patterns 32 are gathered into one set near the edge 31c. FIG. 4 illustrates, as an example, a case that two connection patterns 32 are provided. However, what is described above applies to other cases in which a plurality of connection pattern 32, for example three or four connection pattern 32, are provided, too.

As illustrated in FIG. 3, the insulating layer 34 is provided between the connection pattern 32 and the shield electrode 38. Specifically, the insulating layer 34 is stacked on the shield electrode 38, and the connection pattern 32 is stacked on the insulating layer 34.

The insulating layer 34 is formed in a manner that the shield electrode 38 and a layer of the connection pattern 32 are insulated from each other (not electrically connected to each other). The insulating layer 34 is desirably 5 MΩ or more. The insulating layer 34 is neither formed on the touch sensing electrode 41 nor in the vicinity of the touch sensing electrode 41. The insulating layer 34 is formed by printing, for example, an insulating ink.

In the panel body 30 formed as described above, the design layer 36 is stacked on the one surface 31a of the panel section 31, and the touch sensing electrode 41 is formed as well. The shield electrode 38 is stacked on the design layer 36. The insulating layer 34 is stacked on the shield electrode 38. The connection pattern 32 is stacked on the insulating layer 34.

Next, the circuit device 200 will be described. FIG. 5 is a circuit diagram illustrating the circuit device 200. As illustrated in FIG. 5, the circuit device 200 is inserted between a high-frequency power supply 100 and the touch sensing electrodes 41 and the shield electrode 38. The high-frequency power supply 100 applies a voltage to the touch sensing electrodes 41 and the shield electrode 38. The circuit device 200 includes a signal processing circuit, a wiring 220, and a shield signal generation circuit 300, as denoted by a two-dot chain line in FIG. 2.

A single signal processing circuit is used for each one of the touch sensing electrodes 41. Therefore, FIG. 5 illustrates exemplarily a state that the circuit device 200 includes two signal processing circuits 210a and 210b. Since the signal processing circuits 210a and 210b may have substantially the same structure as each other, one signal processing circuit 210a will be described as a representative example. FIG. 2 illustrates the one signal processing circuit 210a as a representative of the signal processing circuits 210a and 210b.

Figure 6:
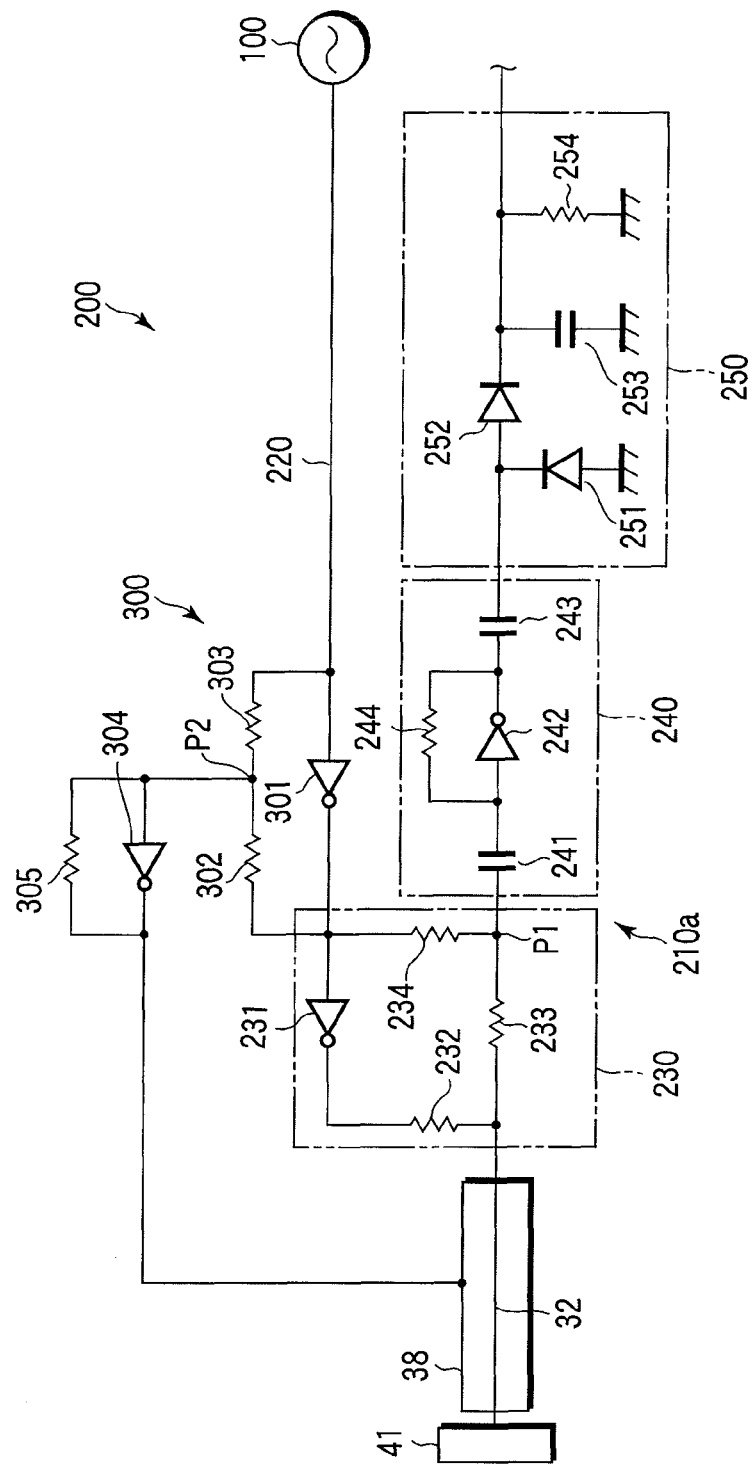
FIG. 6 is a circuit diagram illustrating one signal processing circuit, a wiring, and a shield signal generation circuit.

FIG. 6 is a circuit diagram illustrating the one signal processing circuit 210a, the wiring 220, and the shield signal generation circuit 300, which are used in FIG. 5. As denoted by a two-dot chain line in FIG. 6, the signal processing circuit 210a includes a detector circuit 230, an amplifier circuit 240, and a wave detector circuit 250. A rectangular wave signal (voltage) output from the high-frequency power supply 100 passes through the detector circuit 230, is next amplified through the amplifier circuit 240, and is subsequently converted into a direct current through the wave detector circuit 250. As illustrated in FIG. 5, the wave detector circuit 250 is connected to a control device 400, and a signal which has passed through the wave detector circuit 250 is input to the control device 400.

By detecting a signal which has passed through the signal processing circuit 210a or 210b, the control device 400 detects that the touch sensing electrode 41 has been operated (touched). The control device 400 is connected to an audio device and controls operation of the audio device upon detection made as described above.

As illustrated in FIG. 6, the detector circuit 230 is connected to the high-frequency power supply 100 through the wiring 220. The detector circuit 230 includes a first inverter 231, a first resistor 232 (impedance element), a second resistor 233, and a third resistor 234.

The first inverter 231, first resistor 232, and second resistor 233 are connected in series to one another. A series circuit constituted by the first inverter 231, first resistor 232, and second resistor 233 is connected in parallel with the third resistor 234. The first inverter 231 is, for example, of HCU04 type.

Resistance R1 of the first resistor 232, resistance R2 of the second resistor 233, and resistance R3 of the third resistor 234 satisfy a relationship of $R1+R2=R3$.

In the detector circuit 230, a downstream side of the first resistor 232 and an upstream side of the second resistor 233 is electrically connected to the connection pattern 32.

The amplifier circuit 240 includes a first capacitor 241, a second inverter 242, a second capacitor 243, and a fourth resistor 244. The first capacitor 241, second inverter 242, and second capacitor 243 are connected in series. The fourth resistor 244 is connected in parallel with the second inverter 242.

The wave detector circuit 250 includes first and second rectifiers 251 and 252, a third capacitor 253, and a fifth resistor 254. The first rectifier 251 is connected in series to the second capacitor 243. The second rectifier 252 is connected, at one end, to a downstream side of the second capacitor 243 and an upstream side of the first rectifier 251. The other end of the second rectifier 252 is grounded. The third capacitor 253 and fifth resistor 254 are connected, at one ends, to a downstream side of the first rectifier 251, and are grounded at the other ends.

When the control device 400 detects change (in voltage) of a signal, the control device 400 then detects that the touch sensing electrode 41 has been operated (touched through the panel section 31).

As illustrated in FIG. 5, the other signal processing circuit 210b has substantially the same structure as described above. The first inverter 231 of the detector circuit 230 in the signal processing circuit 210a is used in common by the other signal processing circuit 210b. Even if three or more signal processing circuits are used, the first inverter 231 is used in common.

The wiring 220 connects the high-frequency power supply 100 to the signal processing circuits 210a and 210b (detector circuit 230).

As illustrated in FIGS. 5 and 6, the shield signal generation circuit 300 is connected to upstream sides of the signal processing circuits 210a and 210b (detector circuit 230). The shield signal generation circuit 300 includes a third inverter 301, a sixth resistor 302, a seventh resistor 303, a fourth inverter 304 (output buffer circuit portion), and an eighth resistor 305.

The third inverter 301 is built in an upstream side of the detector circuit 230 on the wiring 220. The third inverter 301 is, for example, of HCU04 type.

The sixth resistor 302 and seventh resistor 303 are connected in series, forming a series circuit. The series circuit constituted by the sixth and seventh resistors 302 and 307 is connected to the wiring 220, in parallel with the third inverter 301. The sixth resistor 302 is connected to a downstream side of the third inverter 301 and an upstream side of the detector circuit 230. The seventh resistor 303 is connected to an upstream side of the third inverter 301.

Resistance R6 of the sixth resistor 302 and resistance R7 of the seventh resistor 303 satisfy a relationship of a ratio of R6 to R7=a ratio of R1 to R2+R3. That is, R6:R7=R1:R2+R3.

The fourth inverter 304 is connected, at one end, between the sixth and seventh resistors 302 and 303, and is electrically connected, at the other end, to the shield electrode 38 through the second wiring 37b. The fourth inverter 304 is, for example, of HCU04 type (C-MOS inverter). The eighth resistor 305 is connected in parallel with the fourth inverter 304.

Resistance R8 of the eighth resistor 305, resistance R6 of the sixth resistor 302, and resistance R7 of the seventh resistor 303 satisfy a relationship of R8=R6//R7 (where "//" expresses parallel resistance).

Next, operation of the circuit device 200 will be described. At first, operation of the signal processing circuits 210a and 210b will be described. A rectangular wave signal applied from the high-frequency power supply 100 passes through the wiring 220 and is then applied to the signal processing circuits 210a and 210b. Halfway, the rectangular wave signal is inverted by the third inverter 301 provided on the wiring 220. The inverted rectangular wave signal is applied to the first inverter 231 and the third resistor 234.

The rectangular wave signal applied to the first inverter 231 is further inverted by the first inverter 231. The rectangular wave signal which has passed through the first inverter 231 comes to be put in the same state as output from the high-frequency power supply 100.

Subsequently, the rectangular wave signal which has passed through the first inverter 231 passes through the first resistor 232. At this time, the rectangular wave signal is reduced and an amplitude thereof decreases accordingly. The rectangular wave signal which has passed through the first inverter 231 is applied to the touch sensing electrode 41, and passes through the second resistor 233. The rectangular wave signal passes through the second resistor 233 and is thereby reduced. Accordingly, the amplitude decreases much more.

Meanwhile, a rectangular wave signal applied to the third resistor 234 passes through this third resistor 234, and is thereby reduced. Accordingly, an amplitude thereof decreases.

The rectangular wave signals which have passed through the second and third resistors 233 and 234 are synthesized at a cross point P1 (a meeting point in the downstream side of the second and third resistors 233 and 234)

As described above, resistance R1 of the first resistor 232+ resistance R2 of the second resistor 233=resistance R3 of the third resistor 234. As a result of this, the rectangular wave signal which has passed through the first and second resistors 232 and 233, and the rectangular wave signal which has passed through the third resistor 234 have an equal amplitude. However, the rectangular wave signal which has passed through the first and second resistors 232 and 233 has already passed through the first inverter 231, and is therefore inverted relative to the rectangular wave signal which has passed through the third resistor 234.

Therefore, a signal synthesized at the cross point P1 is flat. The signal synthesized at the cross point P1 passes through the amplifier circuit 240 and the wave detector circuit 250, and reaches the control device 400.

When an operator touches the touch sensing electrode 41 through the panel section 31, a slight amount of current then flows from the touch sensing electrode 41 to the operator. As a result of this, an amplitude of a rectangular wave signal passing through the second resistor 233 of the signal processing circuit which is connected to the touched touch sensing electrode 41 becomes much smaller, compared with when the touch sensing electrode 41 is not touched by the operator.

Since the amplitude of the rectangular wave signal which has passed through the second resistor 233 becomes much smaller, the rectangular wave signal synthesized at the cross point P1 is not flat. By detecting this, the control device 400 detects that the operator has touched the touch sensing electrode 41.

Next, operation of the shield signal generation circuit 300 will be described. As illustrated in FIG. 6, the rectangular wave signal which has passed through the seventh resistor 303 and the rectangular wave signal which has passed through the third inverter 301 and the sixth resistor 302 are synthesized at a cross point P2 (in the downstream side of the sixth and seventh resistors 302 and 303).

The rectangular wave signal which has passed through the sixth resistor 302 passes the third inverter 301, and is thereby inverted relative to the rectangular wave signal which has passed through the seventh resistor 303.

Further, as described above, R6:R7=R1:R2+R3 is given. Accordingly, the signal synthesized at the cross point P2 has an amplitude equal to the signal applied to the touch sensing electrode 41, and is inverted relative to the signal applied to the touch sensing electrode 41.

Since the resistance R8 of the eighth resistor 305 is set to R8=R6//R7 (where "//" expresses parallel resistance), the fourth inverter 304 and eighth resistor 305 and the sixth resistor 302 and seventh resistor 303 form an inverting amplifier circuit having a gain 1.

Accordingly, the rectangular wave signal which has passed through the cross point P2 passes through the fourth inverter 304 and is thereby inverted. However, an amplitude thereof is equal to that at the cross point P2.

Therefore, the signal which has passed through the fourth inverter 304 has the same potential and phase as the signal applied to the touch sensing electrode 41. The signal generated by the shield signal generation circuit 300 is applied to the shield electrode 38 through the second wiring 37b.

In the circuit device 200 constructed as described above, change of a signal caused by an touch on the touch sensing electrode 41 by an operator influences the downstream side of the touch sensing electrode 41. Specifically, the rectangular wave signal applied to the second resistor 233 is reduced, and therefore, an amplitude of the rectangular wave signal decreases.

Thus, change of a signal caused by a touch on the touch sensing electrode 41 influences the detector circuit 230 and the downstream side of the detector circuit 230. In the circuit device 200, the shield signal generation circuit 300 is provided in the upstream side of the detector circuit 230.

Therefore, change of a signal caused by a touch on the touch sensing electrode 41 does not influence the shield signal generation circuit 300. Accordingly, even when high-frequency noise and the like propagating in the space are applied to the touch sensing electrode 41, the signal (voltage) applied to the shield electrode 38 does not change.

As a result of this, reduction of shield effect against external noise can be restricted. Further, even in the case of constructing a plurality of touch sensing electrodes 41, only a single circuit is enough to constitute the shield electrode 38 and the shield signal generation circuit 300. Accordingly, shield wirings can be constructed with a simple structure, and increase of costs for the shield signal generation circuit can be restricted.

In the present embodiment, the high-frequency power supply 100 outputs a rectangular wave signal. However, the embodiment is not limited hitherto. For example, a sine wave signal is available. In brief, any signal is available insofar as a synthesized wave is flat when forming a synthesized wave at the cross point P1.

Also in the present embodiment, the circuit device 200 is used in a switch panel device for an audio device or the like. However, the embodiment is not limited hitherto. The circuit device 200 may be used in other devices.

The present invention is not exactly limited to the embodiment described above but can be embodied with componential elements modified in a practical phase within a scope of not deviating from the subject matter of the invention. Further, various invention can be derived from appropriate combinations of a plurality of componential elements disclosed in the embodiments described above. For example, several componential elements may be removed from the whole componential elements suggested in the above embodiments. Further, componential elements may be appropriately combined between different embodiments.

The present invention can provide an electrostatic capacitive touch sensor device which is capable of forming a shield function by one shield signal source and shield electrodes constructed in one circuit, and obtains high shield effect against external noise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electrostatic capacitive touch sensor device, comprising:
   a first sensing electrode having a first electrostatic capacitance value that changes depending on a touch operation by an operator;
   a second sensing electrode having a second electrostatic capacitance value that changes depending on a touch operation by the operator;
   a wave signal source that outputs a wave signal;
   a wiring that connects the wave signal source to the first and second sensing electrodes to provide the wave signal to the first and second sensing electrodes;
   a first impedance element provided in the wiring at a position between the first sensing electrode and the wave signal source;
   a second impedance element provided in the wiring at a position between the second sensing electrode and the wave signal source;
   a first shield element that shields the wiring between the first sensing electrode and the first impedance element;
   a second shield element that shields the wiring between the second sensing electrode and the second impedance element;
   a first detector circuit connected to the first sensing electrode and the wave source signal, and outputting a first output signal that changes in accordance with changes in the electrostatic capacitance value of the first sensing electrode;
   a second detector circuit connected to the second sensing electrode and the wave source signal, and outputting a second output signal that changes in accordance with changes in the electrostatic capacitance value of the second sensing electrode; and
   a shield signal source connected to the wave signal source and to the first and second shield elements, and applying a shield signal to the first and second shield elements, the shield signal having a same phase and an amplitude as the wave signal, the shield signal source being directly connected to the wire at a position between the wave signal source and the first and second detector circuits.

2. The electrostatic capacitive touch sensor device according to claim 1, wherein the shield signal source includes an output buffer circuit portion, and an output impedance value of the shield signal source is smaller than an output impedance value of the first and second impedance elements, respectively.

3. The electrostatic capacitive touch sensor device according to claim 2, wherein the wave signal is a rectangular wave signal, the impedance element is a resistor, and the output buffer circuit portion is a C-MOS inverter element.

* * * * *